US010173792B1

(12) United States Patent
Burckel (10) Patent No.: US 10,173,792 B1
(45) Date of Patent: Jan. 8, 2019

(54) PASSIVE RADIATIVE COOLING OF A BODY

(71) Applicant: National Technology & Engineering Solutions of Sandia, LLC, Albuquerque, NM (US)

(72) Inventor: David Bruce Burckel, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 304 days.

(21) Appl. No.: 14/950,298

(22) Filed: Nov. 24, 2015

(51) Int. Cl.
*G03F 7/00* (2006.01)
*B64G 1/58* (2006.01)
*B64G 1/54* (2006.01)

(52) U.S. Cl.
CPC .......... *B64G 1/58* (2013.01); *B64G 1/54* (2013.01); *G03F 7/0005* (2013.01)

(58) Field of Classification Search
CPC ........... B64G 1/58; B64G 1/54; G03F 7/0005; G02B 5/1809; G02B 6/1225; G02B 6/125; G02B 6/126
USPC .......................... 359/569, 572, 570, 574, 575
See application file for complete search history.

(56) References Cited

U.S. PATENT DOCUMENTS

| | | | | |
|---|---|---|---|---|
| 8,017,923 B2 * | 9/2011 | Inoue | ...................... | G01J 3/108 250/493.1 |
| 2014/0107498 A1 * | 4/2014 | Bower | ................ | A61B 5/02416 600/479 |
| 2016/0204294 A1 * | 7/2016 | Kuznicki | .............. | H01L 31/055 136/257 |

OTHER PUBLICATIONS

Aaswath P. Raman , Marc Abou Anonna , Linxiao Zhu , Eden Rephaeli & Shanhui Fan. Passive radiative cooling below ambient air temperature under direct sunlight. 540 | Nature | vol. 515 | Nov. 27, 2014 (Year: 2014).*
X L Liu, B Zhao and Z M Zhang. Blocking-assisted infrared transmission of subwavelength metallic gratings by graphene. Published Feb. 20, 2015. © 2015 IOP Publishing Ltd (Year: 2015).*
Organ Pipe Radiant Modes of Periodic Micromachined Silicon Substrates, Hesketh et al., *Nature*, vol. 324, pp. 549-551, Dec. 11, 1986.
Passive Radiative Cooling Below Ambient Air Temperature Under Direct Sunlight, Raman et al., *Nature*, vol. 515, pp. 544-550, Nov. 27, 2014.

(Continued)

*Primary Examiner* — Collin X Beatty
(74) *Attorney, Agent, or Firm* — Martin I. Finston; Eugene J. Rosenthal (57) ABSTRACT

A metallic waveguide tuned to an infrared region of interest provides spectral and spatial control over emitted/absorbed thermal radiation. The ratio of the depth of the waveguide to the smallest lateral dimension thereof is such that that the lateral dimension provides spectral selectivity and that the waveguide is deep enough for a fixed lateral dimension to establish directionality but is not so deep that it incurs severe ohmic losses. A panel with an array of such waveguides directs thermal radiation from a body in a specific direction and with a spectral response that is the result of the physical dimensions of the individual waveguides that make up the waveguide array and the arrangement of the waveguides in the array. The waveguide axis may be obliquely oriented with respect to the substrate normal so as to impart non-normal directionality to the emitted radiation with respect to the substrate normal surface.

16 Claims, 10 Drawing Sheets

(56) References Cited

OTHER PUBLICATIONS

The Radiative Cooling of Selective Surfaces, Catalanotti et al., *Solar Energy*, vol. 17, pp. 83-89, 1975.
Thermal Performance of Radiative Cooling Panels, Berdahl et al, *International Journal Heat Mass Transfer*, vol. 26, No. 6, pp. 871-880, 1983.
Ultrabroadband Photonic Structures to Achieve High-Performance Daytime Radiative Cooling, Rephaeli et al., *Nano Letters*, pp. 1457-1461, 2013.

* cited by examiner

PASSIVE RADIATIVE COOLING OF A BODY

GOVERNMENT RIGHTS IN THIS INVENTION

This invention was made under a CRADA (SC11/01781.00) between Plasmonics Inc., under a U.S. Air Force STTR program grant (contract number FA9453-13-C-0006), and Sandia National Laboratories, operated for the United States Department of Energy.

TECHNICAL FIELD

This invention relates to methods and apparatus to achieve passive radiative cooling of a body.

BACKGROUND OF THE INVENTION

Physical bodies exchange heat with their surroundings in order to achieve thermal equilibrium. Heat can be exchanged by conduction, convection, or radiation. A satellite in space is isolated from other materials and so cannot employ either conduction or convection for cooling. As a result, a satellite can be cooled only using radiative methods. One of the principles of radiative cooling is Kirchoff's Law, which states that in thermal equilibrium the processes of thermal absorption and thermal emission are equivalent. Said another way, things that absorb very well, e.g., a flat black panel, also emit very well.

SUMMARY OF THE INVENTION

In order to emit waste heat from a satellite, one method has been to attach a flat black panel to be used to radiate waste heat into deep space, which has a background temperature of less than 4 degrees Kelvin. A problem arises however if a body other than deep space, such as, for example, the sun, the earth, a planet, a moon, a comet, or the like, subtends a portion of the panel. This is because the panel will readily absorb incident thermal radiation from those objects and could consequently heat up, rather than cool, the satellite.

In accordance with the principles of the invention, it is possible to reject, e.g., reflect, particular incoming wavelengths of radiation while simultaneously emitting other wavelengths of radiation by employing a metallic waveguide that is arranged to be tuned to an infrared (IR) region of interest in order provide both spectral and spatial control over the emitted/absorbed thermal radiation. In accordance with an aspect of the invention, an aspect ratio of the waveguide, i.e., the ratio of the depth of the waveguide to the smallest lateral dimension thereof, is arranged such that the lateral dimension of the waveguide provides spectral selectivity and that the waveguide is deep enough for a fixed lateral dimension to establish directionality but is not so deep that it cannot be manufactured or incurs ohmic losses so great that the waveguide essentially reabsorbs the heat intended to be emitted.

In accordance with a further aspect of the invention, a panel with an array, e.g., a one- or two-dimensional array, of such IR waveguides directs thermal radiation from a body in a specific direction and with a spectral response that is the result of the physical dimensions of the individual waveguides that make up the waveguide array as well as the arrangement of the waveguides in the array. The waveguides in the array need not be all the same, need not be regularly spaced, need not have the same depth, nor do they need the walls thereof to have the same thickness. The array of waveguides may be densely packed.

In accordance with an aspect of the invention, the waveguide axis may be obliquely oriented with respect to the substrate normal, e.g., the normal to the top of the substrate on which the waveguides are manufactured. To this end, the metallic waveguides may be fabricated at an angle with respect to the substrate normal surface so as to impart non-normal directionality to the emitted radiation with respect to the substrate normal surface. Advantageously, the surface normal of the substrate supporting the waveguide array may be pointed toward an emitting body but radiation from that body will not be absorbed because it is not in line with the waveguides of the array.

In an embodiment of the invention, to make the waveguide axis obliquely oriented with respect to the substrate normal, a structure is etched in silicon or other material by using a tilted Faraday cage. The walls of the final angled waveguides that result after etching are coated with metal.

In another embodiment of the invention, the metal waveguides could be etched directly in metal that is placed on a nonmetal substrate or they could be 3D printed.

In another embodiment of the invention, the waveguide structure is created lithographically and then the waveguide walls are coated with metal. For example, such an array of waveguides can be created in photodefinable epoxy, such as EPON™ Resin SU-8, using interferometric lithography.

In yet another embodiment of the invention, contact lithography is used to print the structures.

In various embodiments of the invention, the metal waveguides may be realized on different types of substrate materials. Such substrate materials may include silicon. Such substrate materials may also include various flexible substrates such as 1) polyimides, 2) poly (4,4'-oxydiphenylene-pyromellitimide), for example, KAPTON®, 3) biaxially-oriented polyethylene terephthalate (BoPET), such as MYLAR®, 4) paper or 5) the like. Advantageously, large area sheets of materials covered with metallic waveguides, which may be angled, may be produced, and such sheets could be made to conform to non-planar surfaces if necessary or desired.

In one embodiment of the invention, a spacecraft includes a surface for emitting heat that includes at least one metallic waveguide that is arranged to be tuned to an infrared (IR) region of interest to be emitted while not absorbing radiation from other bodies, wherein the at least one waveguide may be part of an array or collection of such waveguides.

In one embodiment of the invention, an array of metallic waveguides may be employed on the exterior, e.g., the roof or side walls, of a building or structure, e.g., a house, to cool the building, by having heat from the building being directed toward deep space. In another embodiment of the invention, an array of metallic waveguides may be employed on the exterior, e.g., the roof or side walls, of a building or structure, e.g., a house, to heat the structure, by having heat from the sun being directed toward the structure's interior.

DETAILED DESCRIPTION

The following merely illustrates the principles of the invention. It will thus be appreciated that those skilled in the art will be able to devise various arrangements that, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative components embodying the principles of the invention.

Unless otherwise explicitly specified herein, the drawings are not drawn to scale.

In the description, identically numbered components within different ones of the FIGs. refer to the same components.

In accordance with the principles of the invention, it is possible to reject, e.g., reflect, particular incoming wavelengths of radiation while simultaneously emitting other wavelengths of radiation by employing a metallic waveguide that is arranged to be tuned to an infrared (IR) region of interest in order provide both spectral and spatial control over the emitted/absorbed thermal radiation. In accordance with an aspect of the invention, an aspect ratio of the waveguide, i.e., the ratio of the depth of the waveguide to the smallest lateral dimension thereof, is arranged such that the lateral dimension of the waveguide provides spectral selectivity and that the waveguide is deep enough for a fixed lateral dimension to establish directionality but is not so deep that it cannot be manufactured or incurs ohmic losses so great that the waveguide essentially reabsorbs the heat intended to be emitted. In embodiments of the invention, the lateral dimension may be chosen so as to position the primary absorption lobe of the waveguide according to wavelength, and the depth may then be chosen so as to be equal to the shallowest depth that yields the directionality desired. In embodiments of the invention, the depth of the waveguides may range from about 5 µm to about 100 µm.

Note that the directionality of emission in accordance with the principles of the invention, which is in line with the depth axis of the waveguide, is an advantageous improvement over a black panel of the prior art which absorbs in all directions. Advantageously, embodiments of the invention absorb IR radiation in the direction of the waveguide axis and substantially reject IR radiation from all other directions.

In accordance with a further aspect of the invention, a panel with an array, e.g., a one- or two-dimensional array, of such IR waveguides directs thermal radiation from a body in a specific direction and with a spectral response that is the result of the physical dimensions of the individual waveguides that make up the waveguide array as well as the arrangement of the waveguides in the array. The waveguides in the array need not be all the same, need not be regularly spaced, need not have the same depth, nor do they need the walls thereof to have the same thickness.

Figure 1:
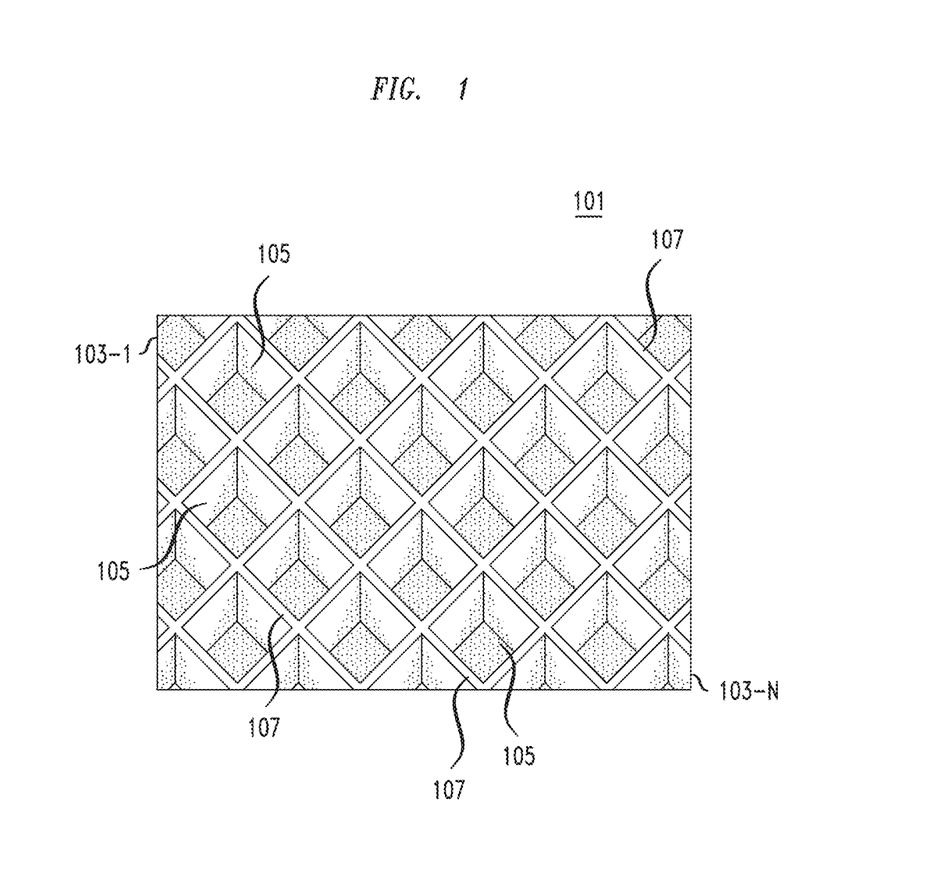
FIG. 1 shows a portion of an exemplary array of individual exemplary metal waveguides arranged in accordance with the principles of the invention so as to be tuned to an infrared (IR) region of interest.

Shown in FIG. 1 is a portion of exemplary array 101 of individual exemplary metal waveguides 103-1 though 103-N, collectively metal waveguides 103, only some of which are particularly enumerated with a reference identifier, arranged in accordance with the principles of the invention so as to be tuned to an infrared (IR) region of interest. In the exemplary embodiment of the invention shown in FIG. 1, each of metal waveguides 103 has a 5 µm by 5 µm cavity 105 which is 15 microns deep and has 3 µm thick walls 107. Any metal, preferably one with high reflectivity, e.g., gold, aluminum, and the like, may be used to coat walls 107 making up metal waveguides 103. Heat or energy to be emitted by array 101 enters the waveguides from their respective bottoms, which should be in contact with what is to be cooled.

Table 1 shows exemplary dimensions for other various embodiments of waveguides with a square cross section. All of the waveguides were etched to an exemplary depth of 15 µm.

TABLE 1

| Square Cross Section | | |
| --- | --- | --- |
| a (µm) | b (µm) | Wall (µm) |
| 4 | 4 | 2 |
| 4 | 4 | 2.4 |
| 4 | 4 | 2.8 |
| 5 | 5 | 2.5 |
| 5 | 5 | 3 |
| 5 | 5 | 3.5 |

TABLE 1-continued

Square Cross Section

| a (μm) | b (μm) | Wall (μm) |
|---|---|---|
| 6 | 6 | 3 |
| 6 | 6 | 3.6 |
| 6 | 6 | 4 |

Figure 2:
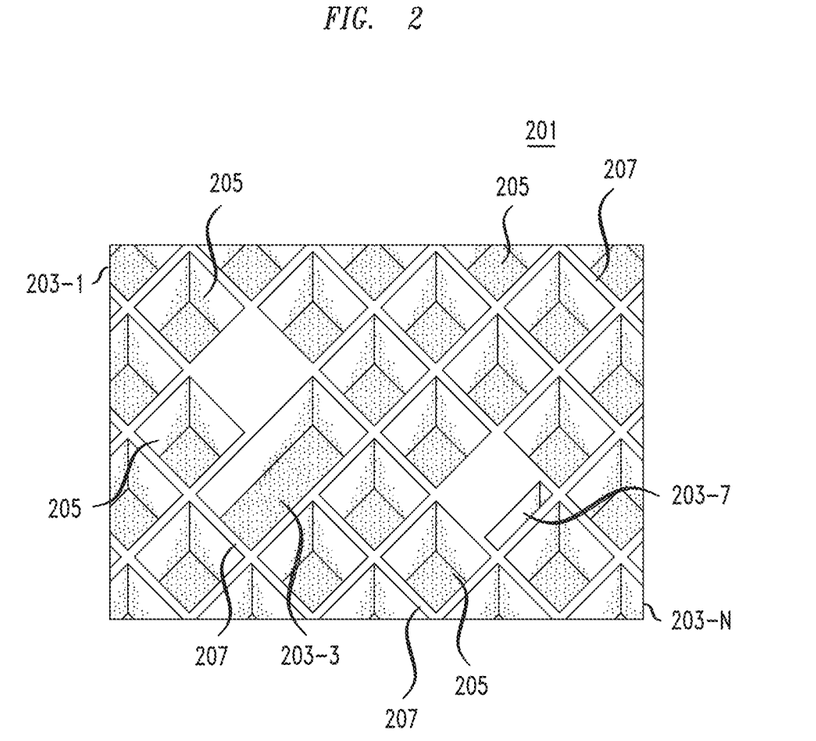
FIG. 2 shows a portion of another exemplary array of individual exemplary metal waveguides arranged in accordance with the principles of the invention so as to indicate that the waveguides in the array may have different characteristics.

In the manner shown in FIG. 2, the waveguides in the array need not be all the same, need not be regularly spaced, need not have the same depth, need not have the same shape, nor do the walls thereof need to have the same thickness. Consequently, as used in regard to this embodiment, the term "array" is used more generally in the sense of being an ordered arrangement such as a collection, selection, or assortment. Waveguides may be arranged in arrays of one or two dimensions, i.e., for the end of the waveguides that are distal to the substrate when the substrate surface is in a planar configuration. Rather, in the manner shown in FIG. 2, exemplary array 201 of individual exemplary metal waveguides 203-1 though 203-N, collectively metal waveguides 203, only some of which are particularly enumerated with a reference identifier, are arranged in accordance with the principles of the invention. In the exemplary embodiment of the invention shown in FIG. 2, each of metal waveguides 203 has an appropriately sized cavity 205 which is appropriately deep and walls 207 each of which has an appropriate thickness. Any suitable metal may be used to coat the exposed portion of walls 207 that is interior to metal waveguides 203. In array 201, the metal used for any particular waveguide, or indeed on any particular wall thereof, need not be the same, nor need they have the same thickness.

Note, too, that in embodiments of the invention the metal waveguides need not have a square cross section but may a have rectangular cross section, e.g., waveguides 203-3 or 203-7, a circular cross section (see FIG. 6), a hexagonal cross section (not shown), an oval cross section (not shown), a cross section that varies with depth, e.g., a horn shape or a cone shape, or any other appropriate cross section shape. Also, the waveguides may also include coaxial components (not shown). Panels made up of such inhomogeneous waveguides may display an ensemble effect wherein the absorption/emission behavior of the panel is due to a combination of multiple waveguides. Furthermore, controlling the design of the waveguides individually may allow for the use of thermal lensing effects where thermal radiation is concentrated in space as well as directed toward a focal point to create further cooling efficiencies.

Table 2 shows exemplary dimensions for other various embodiments of waveguides with a rectangular cross section. All of the waveguides were etched to an exemplary depth of 15 μm.

TABLE 2

Rectangular Cross Section

| a (μm) | b (μm) | Wall (μm) |
|---|---|---|
| 4 | 2 | 2.4 |
| 5 | 2.5 | 3 |
| 6 | 3 | 3.6 |
| 6.45 | 4 | 2.4 |
| 8.05 | 5 | 3 |
| 9.65 | 6 | 3.6 |

Figure 7:
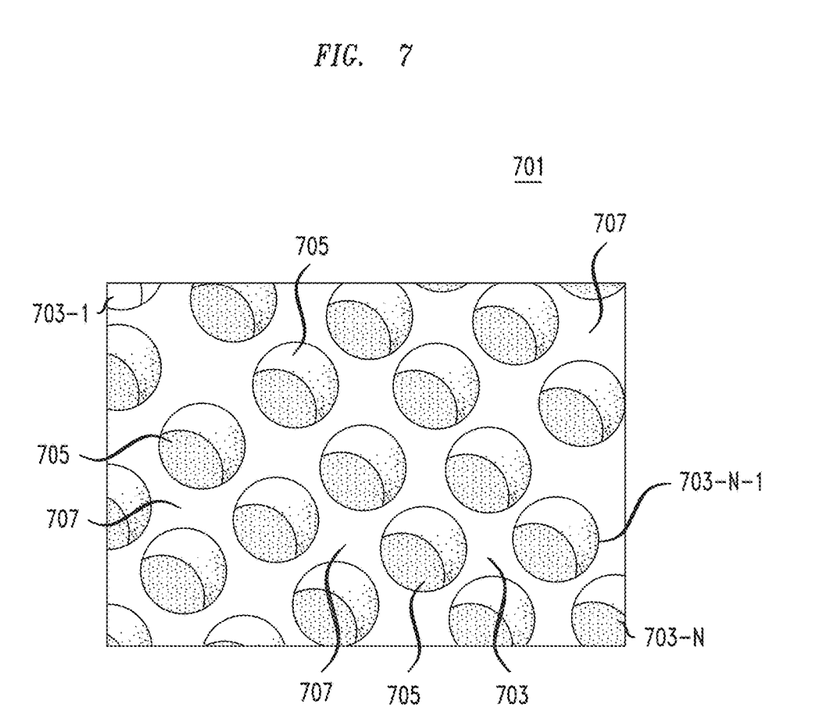
FIG. 7 shows a portion of an exemplary array of individual exemplary metal waveguides having circular cross section and arranged in accordance with the principles of the invention the principles of the invention.

Shown in FIG. 7 is exemplary array 701 of individual exemplary metal waveguides 703-1 though 703-N, collectively metal waveguides 703, only some of which are particularly enumerated with a reference identifier, arranged in accordance with the principles of the invention. In the exemplary embodiment of the invention shown in FIG. 7, each of metal waveguides 703 is tube-shaped in that it has an appropriately sized circular cavity 705 which is appropriately deep and walls 707 each of appropriate thickness. Any suitable metal may be used to coat the exposed portion of walls 707 that is interior to metal waveguides 703. The metal used for any particular waveguide, or indeed on any particular wall thereof, need not be the same, nor need they have the same thickness.

Table 3 shows exemplary dimensions for other various embodiments of waveguides with a circular cross section. All of the waveguides were etched to an exemplary depth of 15 micrometers. In this embodiment of the invention, wall thickness is the distance of closest approach between neighboring cylindrical waveguides.

TABLE 3

Circular Cross Section

| Radius (μm) | Wall (μm) |
|---|---|
| 4 | 2.4 |
| 5 | 3 |
| 6 | 3.6 |

Table 4 shows exemplary dimensions for other various embodiments of waveguides in accordance with the principles of the invention that have an elliptical cross section. All of the waveguides were etched to a depth of 15 μm. In table 4, a and b are the major and minor axes, respectively.

TABLE 4

Elliptical Cross Section

| a (μm) | b (μm) | Wall (μm) |
|---|---|---|
| 5 | 2.5 | 3 |
| 6 | 3 | 3.6 |

Table 5 shows exemplary dimensions for other various embodiments of waveguides in accordance with the principles of the invention that have a square cross section with a square coaxial element. More specifically, the coaxial element of Table 5 is a solid element with a square cross section that is centered in the square waveguide, is coated with metal, and has a dimension for each of its sides as given by "Coax" in Table 5. All of the waveguides were etched to an exemplary depth of 15 μm.

TABLE 5

Square Cross Section Waveguide with Square Coaxial Element

| a (μm) | b (μm) | Wall (μm) | Coax (μm) |
|---|---|---|---|
| 4 | 4 | 2.4 | 0.8 |
| 5 | 5 | 3 | 1 |
| 6 | 6 | 3.6 | 1 |

Table 6 shows exemplary dimensions for other various embodiments of waveguides in accordance with the principles of the invention that have a circular cross section with a circular coaxial element. The coaxial element of Table 6 is a solid element with a circular cross section that is centered in the waveguide, is coated with metal, and has a radius as given by "Coax" in Table 6. All of the waveguides were etched to an exemplary depth of 15 µm.

TABLE 6

Circular Cross Section Waveguide with Circular Coaxial Element

| radius (µm) | Wall (µm) | Coax (µm) |
|---|---|---|
| 5 | 3 | 1 |
| 6 | 3.6 | 1 |

In embodiments of the invention employed for spacecraft applications, a panel carrying the array of waveguides arranged in accordance with the invention should be tuned 1) to emit the radiation that is generated in the spacecraft as heat and 2) to reject radiation from subtended emissive bodies that do not align with the axes of the waveguides of the panel. To this end, it is noted that the cutoff wavelength, i.e., the wavelength $\lambda_c$ of one standing wave in the waveguide is about twice the width of the waveguide. Incident radiation at wavelengths greater than a waveguide's cutoff wavelength will not be admitted to the waveguide but instead will be reflected from it. Thus, the waveguide should be designed to reflect electromagnetic radiation from the sun and other celestial bodies. Wavelengths shorter than the cutoff wavelength are all conducted by the waveguide. Thus, such shorter wavelengths when generated by the spacecraft will be radiated toward deep space.

For a black body at a given temperature, emitted radiation is distributed spectrally according to Planck's radiation law, which indicates that the amount of power that comes at a wavelength, or, in other words, how much power is emitted at each wavelength by a body at a certain temperature T, in degrees kelvin:

$$u_\lambda(\lambda, T) = \frac{2hc^2}{\lambda^5} \frac{1}{e^{hc/\lambda kT} - 1}$$

where
h is Planck's constant;
c is the speed of light;
k is Boltzmann's constant; and
λ is wavelength.

The wavelength of peak emission, $\lambda_{max}$, for a given temperature of a black body is given by Wien's displacement law, which is found by differentiating Planck's law, as $$\lambda_{max}(T) = \frac{2.9 \times 10^6 \text{ nm} \cdot K}{T}$$

where
nm K is nanometer Kelvin; and
T is the temperature of the black body.

For a vacuum or air-filled metallic waveguide with square cross section of width a, the cut-off wavelength, i.e., the longest wavelength capable of propagating in the waveguide, is given to good approximation by:

$$\lambda_c = 2a$$

Table 7 shows the peak emission wavelength for a body at three different temperatures:

TABLE 7

| Temperature (K) | λ max (µm) | a (µm) |
|---|---|---|
| 300 | 9.67 | 4.83 |
| 1000 | 2.90 | 1.45 |
| 6000 | 0.48 | 0.24 |

One reasonable design philosophy as a rule of thumb for designing a square cross section waveguide array for a particular application is to make the waveguide width half of the size of the $\lambda_{max}$ of the expected temperature of the structure to be cooled.

For non-square cross section waveguides, the lateral dimensions can be different, resulting, for example, in rectangular guides, in which case the waveguides become sensitive to polarization and the longer side dictates the longest wavelength that can propagate. It is also possible to make hexagonal cross section or circular cross section waveguides as well as waveguides which include coaxial components as described hereinabove. These waveguides possess more complicated behavior which is more difficult to capture in a rule of thumb sense but can easily be determined by those of ordinary skill in the art using standard waveguide design analysis.

In other embodiments of the invention, instead of being left open to vacuum or to admit air, the waveguides could be filled with a material that is transparent at the wavelengths of interest, e.g., to passivate the metal or to provide a surface at the entrance to the waveguides on which can be put other materials, e.g., reflective materials.

Figure 3:
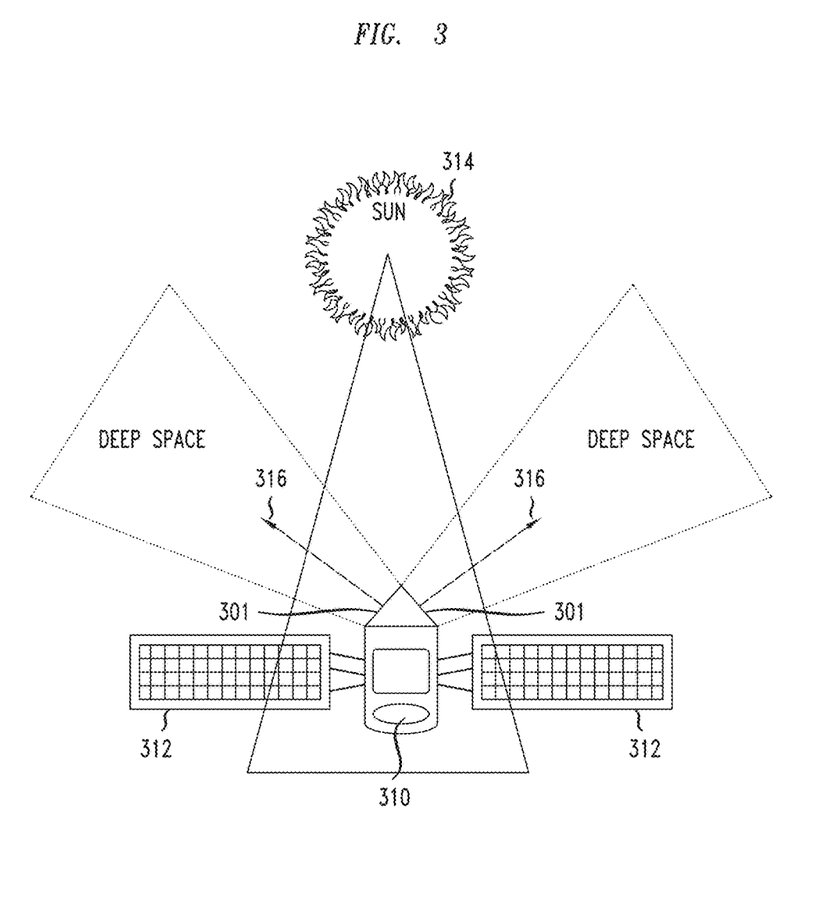
FIG. 3 shows a spacecraft having affixed thereto emissive panels which are made up of arrays of metal waveguides arranged in accordance with the principles of the invention.

FIG. 3 shows spacecraft 310 having attached thereto solar panels 312. Affixed to spacecraft 310 in the manner shown in FIG. 3 are emissive panels 301 which are made up of arrays of metal waveguides arranged in accordance with the principles of the invention so as to be tuned to an infrared (IR) region of interest. Heat or energy to be emitted by emissive panels 301 enters the waveguide from the bottom, which should be in contact with what is to be cooled. A cooling system may be arranged to bring the heat to be emitted to the substrate at the bottom of the waveguides.

Advantageously, emissive panels 301 emit radiation from spacecraft 310 in the respective directions indicated by arrows 316 toward deep space. Furthermore, emissive panels 301 do not absorb energy from sun 314 even though energy from sun 314 is incident on emissive panels 301 because the energy from sun 314 is not at an angle that can be accepted by the IR metal waveguides of panels 301. This is advantageous over prior art flat black panels which might have been used in the same location as emissive panels 301 of FIG. 3. If such prior art flat black panels were to be used, they would be easily able to absorb radiation from sun 314 and so (i) may heat up rather than cool or (ii) may ineffectively cool the spacecraft which requires emitting radiation therefrom, e.g., toward deep space.

Figure 4:
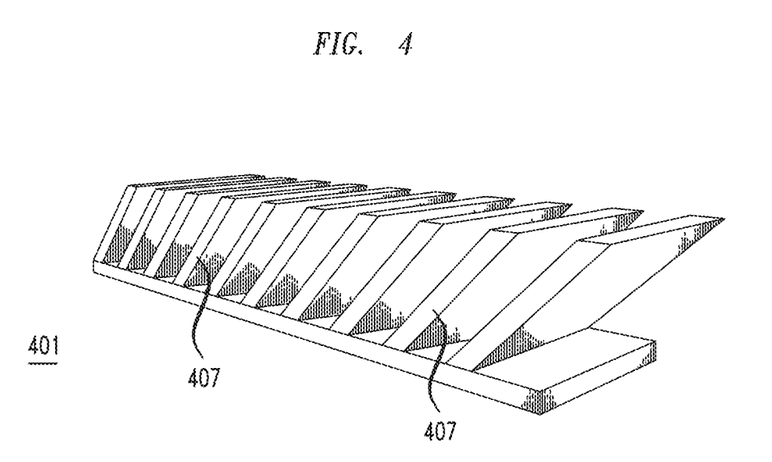
FIG. 4 shows an array of obliquely oriented IR metal waveguides.

In accordance with an aspect of the invention, the waveguide axis may be obliquely oriented with respect to the substrate normal, which is the normal to the top of the substrate on which the waveguides are manufactured. To this end, the metallic waveguides may be fabricated at an angle with respect to the substrate normal surface so as to impart non-normal directionality to the emitted radiation with respect to the substrate normal surface. Advantageously, surface normal of the substrate supporting the waveguide array may be pointed toward an emitting body but radiation from that body will not be absorbed because it is not in line with the waveguides of the array. FIG. 4 shows array 401 of obliquely oriented rectangular metal parallel plate IR waveguides.

Active control of the individual waveguides may be possible using drives such as are typically employed in micro electrical mechanical systems (MEMS), e.g., electrostatic drives, comb drives, or the like. For example, in FIG. 4, beams and drivers may be attached to each end of walls 407 that make up the metal waveguides such that the angle of the walls may be changed. Doing so may affect the directionality and/or wavelength of the radiation emitted by array 401.

Figure 5:
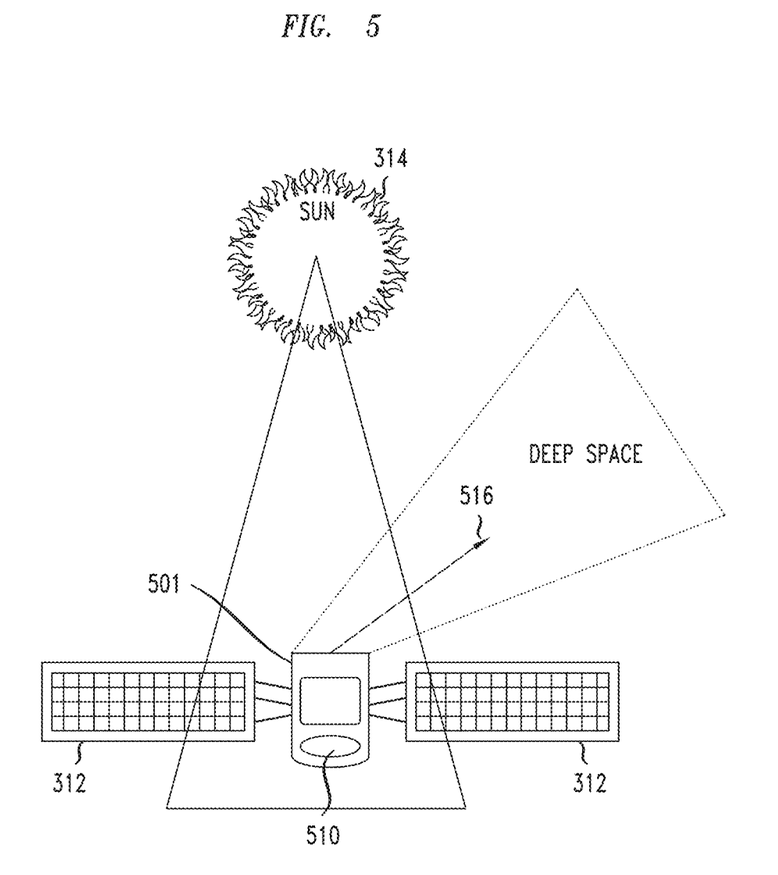
FIG. 5 shows a spacecraft having affixed thereto an emissive panel which is made up of arrays of metal waveguides for which the waveguide axis is obliquely oriented with respect to the substrate normal, in accordance with an aspect of the invention.

FIG. 5 shows spacecraft 510 having attached thereto solar panels 312. Affixed to spacecraft 510 in the manner shown in FIG. 5 is emissive panel 501 which is made up of arrays of metal waveguides arranged in accordance with the principles of the invention so as to be tuned to an infrared (IR) region of interest and for which the waveguide axis is obliquely oriented with respect to the substrate normal. Heat or energy to be emitted by emissive panel 501 enters the waveguide from the bottom, which should be in contact with what is to be cooled. A cooling system may be arranged to bring the heat to be emitted to the substrate at the bottom of the waveguides.

Advantageously, emissive panel 501 emits radiation from spacecraft 510 in the direction indicated by arrow 516 toward deep space. Furthermore, emissive panel 501 does not absorb energy from sun 314 even though energy from sun 314 is incident on emissive panel 501 because the energy from sun 314 is not at an angle that can be accepted by the IR metal waveguides of panel 501. This is advantageous over prior art flat black panels which might have been used in the same location as emissive panel 501 of FIG. 5. If such prior art flat black panels were to be used, they would absorb radiation from sun 314 and would heat up the spacecraft rather than cooling the spacecraft by emitting radiation therefrom toward deep space as desired.

Figure 8:
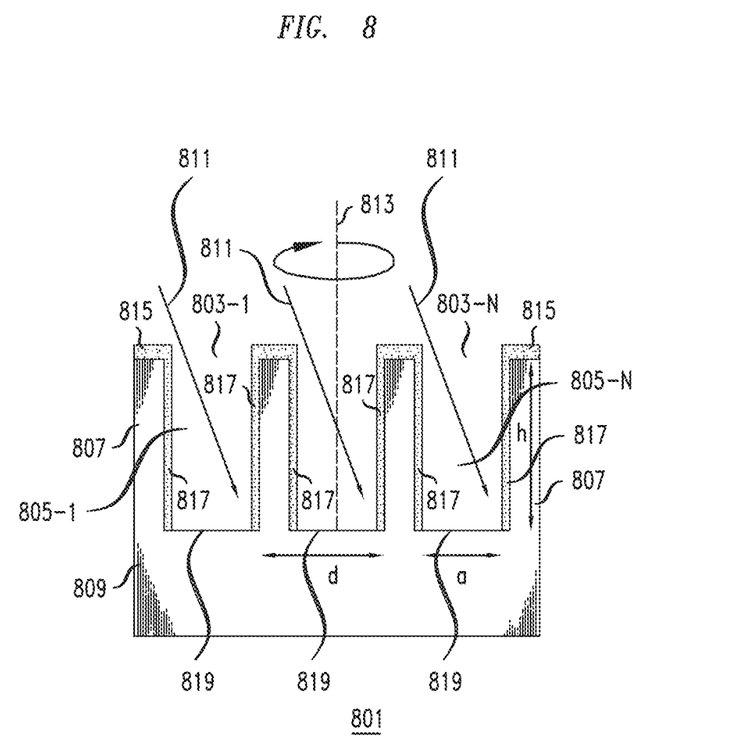
FIG. 8 shows a schematic cross section of two-dimensional waveguide array made up of individual exemplary metal waveguides arranged in accordance with the principles of the invention.

FIG. 8 shows a schematic cross section of two-dimensional waveguide array 801 which is made up of individual exemplary metal waveguides 803-1 though 803-N, collectively metal waveguides 803, only some of which are particularly enumerated with a reference identifier, arranged in accordance with the principles of the invention. In the manner shown in FIG. 8, an array of square cross section cavities 805-1 through 805-N, collectively cavities 805, having side a, are placed so as to have period d. The cavities are etched into single crystal silicon substrate 809 to a depth, h forming walls 807.

A metal, preferably a highly reflective metal such as gold, is deposited, e.g., evaporated, electroplated, or sputtered, at an angle indicated by arrows 811 with respect to the substrate surface such that the evaporation does not coat the bottom of etched cavities 805. Substrate 809 is rotated during the metal deposition about rotation axis 813 so as to coat the sides and tops of the silicon surface with gold. For example, an about 5000 Å coating 815 may be formed on the top of walls 807 while an about 500 Å coating 817 may be formed on the sides of walls 807 due to the increased surface area relative to the waveguide cross section. Floors 819 are substantially not coated in metal and are left open to the silicon substrate. Doing so enables heat radiation to pass through metal waveguides 803. The direction of emission for waveguide array 801 is normal to substrate 809, e.g. the plane defined by floors 819 or the bottom of substrate 809.

Figure 6:
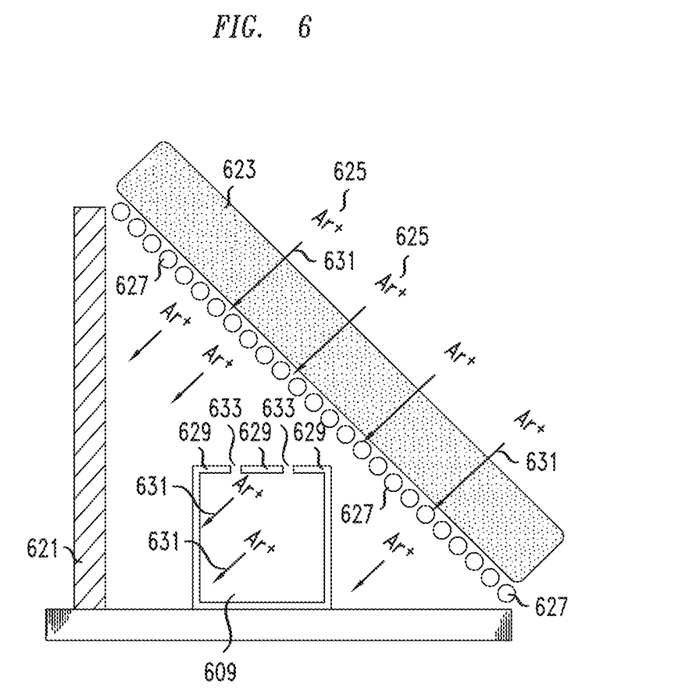
FIG. 6 shows the etching of waveguides in silicon or other material by using a tilted Faraday cage so that the waveguide axis is obliquely oriented with respect to the substrate normal, in accordance with an aspect of the invention.

In an embodiment of the invention, in which the waveguide axis is obliquely oriented with respect to the substrate normal, the waveguides are etched in silicon or other material by using a tilted Faraday cage, e.g., in the manner shown in FIG. 6. More specifically, substrate 609 is covered with mask 629 which is formed thereon. Argon ions (Ar$^+$) 625 are accelerated through angled plasma sheath 623, which is angled at the desired angle for the etching indicated by arrows 631 and pass through wire mesh 627 of Faraday cage 621. Once inside Faraday cage 621 there is no electric field to affect them so argon ions 625 proceed undeflected along a collinear extension of their previous trajectory. Some of argon ions 625 pass through openings 633 in mask 629 and etch substrate 609 at the same angle. Other argon ions may not impact upon substrate 609, may be blocked by mask 629, or may be blocked by a coating applied along the side of substrate 609. The walls of the final angled waveguides that result after etching are coated with metal, e.g., gold.

In one embodiment of the invention, the waveguide structure may be created lithographically and then the waveguide walls are coated with metal. For example, such an array of waveguides can be created in photodefinable epoxy, such as EPON™ Resin SU-8, using interferometric lithography.

In one embodiment of the invention, contact lithography is used to print waveguides and then the waveguide walls are coated with metal.

Figure 9:
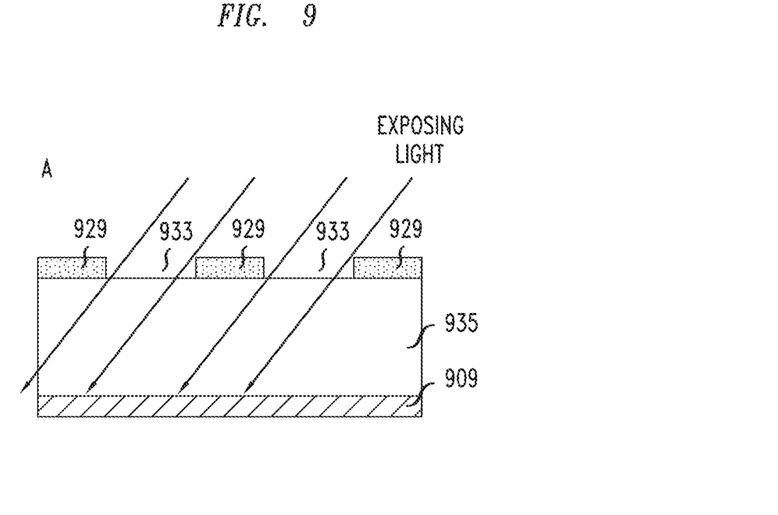
FIG. 9 shows using in a lithographic process exposing light that is angled with respect to the substrate normal, in accordance with an aspect of the invention.

In another embodiment of the invention, an angled waveguide structure is created lithographically and then the waveguide walls are coated with metal. More specifically, in the manner shown in FIG. 9, the incident direction of the light used for lithographic exposure is angled with respect to the normal of substrate 909, and hence with respect to mask 929 being employed. The angled exposing light passes through empty or transparent regions 933 while substantially maintaining its angle with the substrate normal. Photoresist 935 lying beneath transparent regions 933 is exposed, and becomes able to be dissolved by a developer, while photoresist lying under mask 929 did not receive any light exposure and will remain intact after developing. Thus a pattern may be transferred using mask 929 to a sample in the form of photo-sensitive resist material, but the resulting remaining structures are at an angle. The resulting waveguides are then coated with metal.

In various embodiments of the invention, the metal waveguides may be realized, e.g., lithographically, on different types of substrate materials. Such substrate materials may include silicon. Such substrate materials may also include various flexible substrates such as 1) polyimides, 2) poly (4,4'-oxydiphenylene-pyromellitimide), for example, KAPTON®, 3) biaxially-oriented polyethylene terephthalate (BoPET), such as MYLAR®, 4) paper or 5) the like. Advantageously, large area sheets of materials covered with metallic waveguides, which may be angled, may be produced, and such sheets could be made to conform to non-planar surfaces if necessary or desired.

In another embodiment of the invention, the metal waveguides could be etched directly in metal, e.g., a metal substrate, they could be 3D printed, they could be electrochemically deposited, or they could be stamped into a substrate.

In one embodiment of the invention, an array of metallic waveguides may be employed on the exterior, e.g., the roof or side walls, of a building or structure, e.g., a house, to cool the building, by having heat from the building being directed toward deep space. In another embodiment of the invention, an array of metallic waveguides may be employed on the exterior, e.g., the roof or side walls, of a building or structure, e.g., a house, to heat the structure, by having heat from the sun being directed toward the structure's interior.

Figure 10:
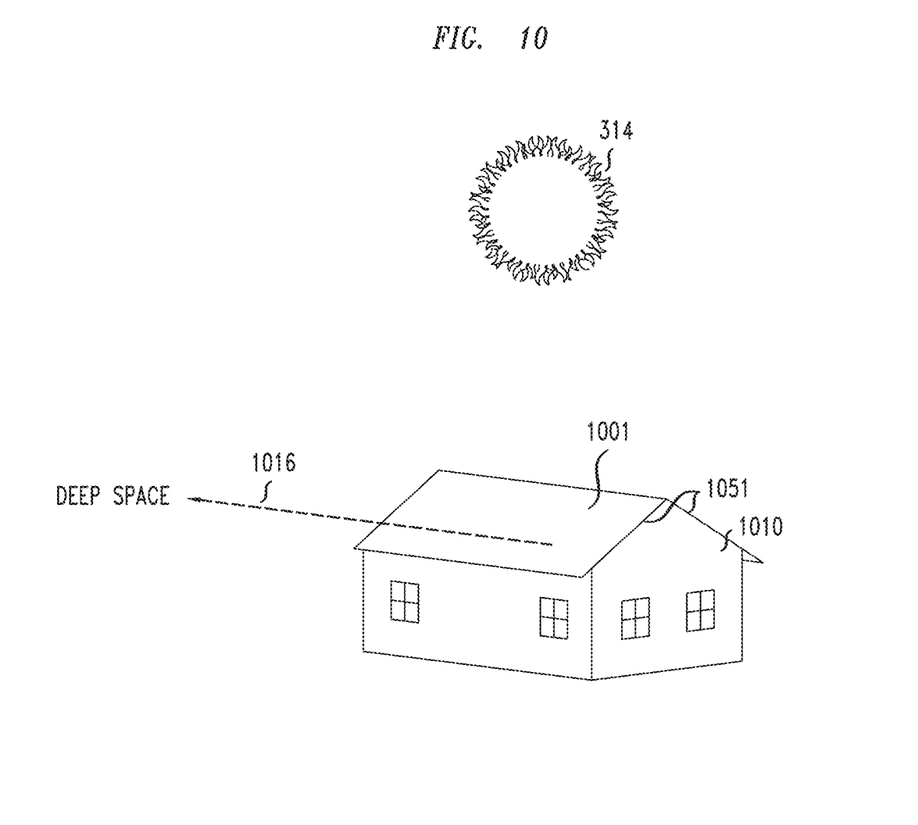
FIG. 10 shows a house having affixed on the roof thereof an emissive panel which is made up of arrays of metal waveguides that are arranged in accordance with the principles of the invention.

FIG. 10 shows house 1010 having affixed on the roof thereof emissive panel 1001 which is made up of arrays of metal waveguides arranged, in accordance with the principles of the invention, so as to be tuned to an infrared (IR) region of interest. Heat or energy to be emitted by emissive panel 1001 enters the waveguides from the bottom, which should be in contact with what is to be cooled. In one embodiment of the invention, emissive panel 1001 is in contact with a portion of roof 1051 of house 1010 and conducts heat from there. In another arrangement, a convective system may be arranged, such as a water-based or air-based system, to bring heat from inside the house to the bottom of panel 1001 in a more efficient manner.

Advantageously, emissive panel 1001 emits radiation from house 1010 in the direction indicated by arrow 1016 toward deep space. Furthermore, emissive panel 1001 does not absorb energy from sun 314, even though energy from sun 314 is incident on emissive panel 1001, because the energy from sun 314 is not at an angle that can be accepted by the metal IR waveguides of panels 1001.

In the event of a flat roof or other unfavorable location of house 1010, emissive panel 1001 may employ waveguides that have their axes obliquely oriented with respect to the substrate normal.

In another embodiment of the invention, an array of metallic waveguides may be employed on the roof of a house to heat the house by having heat from the sun being directed toward the home interior. In the embodiment of the invention shown in FIG. 10, emissive panel 1001 is replaced with a panel having waveguides that are arranged to direct incident thermal radiation from sun 314 into house 1010.

What is claimed is:

1. A metallic waveguide adapted to a prescribed infrared (IR) region so as to provide a specified spectral and spatial thermal radiation emissivity response, wherein the metallic waveguide exhibits a cutoff wavelength that is about twice a lateral waveguide dimension, and wherein:
    the metallic waveguide has a depth and a smallest lateral dimension;
    a ratio of the depth of the metallic waveguide to the smallest lateral dimension is such that the smallest lateral dimension of the metallic waveguide provides spectral selectivity;
    the metallic waveguide is deep enough for the smallest lateral dimension to establish directionality of the specified spectral and thermal radiation emissivity response along an axis of the waveguide but is not so deep that ohmic loss causes the metallic waveguide to reabsorb radiation intended to be emitted; and
    the specified spectral thermal emissivity response is such that the metallic waveguide rejects waves of wavelengths greater than about two times a width of said metallic waveguide.

2. The invention as defined in claim 1 wherein said waveguide has a cross section that is one of the group consisting of: square, rectangular, round, elliptical, hexagonal, and varying with depth.

3. The invention as defined in claim 1 wherein said metallic waveguide emits radiation which is a function of a temperature of a device to which it is attached.

4. The invention as defined in claim 1 wherein said metallic waveguide has a waveguide axis and is formed on a substrate and wherein said metallic waveguide emits radiation coupled to said substrate along said waveguide axis, said radiation being emitted being a function of a temperature of a device to which said metallic waveguide is attached, and wherein said metallic waveguide rejects radiation of an object that is incident onto said metallic waveguide at an end thereof distal to said substrate when said incident radiation is not in alignment with said waveguide axis.

5. The invention as defined in claim 1 wherein said metallic waveguide has a waveguide axis and is formed on a substrate, and wherein said waveguide axis is obliquely oriented with respect to a normal of said substrate.

6. The invention as defined in claim 1 wherein said waveguide is adapted to perform radiative cooling.

7. The invention as defined in claim 1 wherein said metallic waveguide has a depth in a range of about 5 μm to about 100 μm.

8. The invention as defined in claim 1 wherein said spatial thermal emissivity response is parallel to a normal to a substrate on which said metallic waveguide is formed.

9. The invention as defined in claim 1 wherein said spatial thermal emissivity response is not parallel to a normal to a substrate on which said metallic waveguide is formed.

10. The invention as defined in claim 1 wherein said waveguide comprises a coaxial element.

11. The invention as defined in claim 1 wherein said spectral thermal emissivity response is a function of a width of said metallic waveguide.

12. An array of metallic infrared (IR) waveguides that direct thermal radiation from said array in a prescribed direction and with a spectral response that is a function of physical dimensions of said waveguides, wherein each metallic waveguide of the array exhibits a cutoff wavelength that is about twice a lateral waveguide dimension, and wherein:
    each metallic waveguide has a depth and a smallest lateral dimension;
    a ratio of the depth of the metallic waveguide to the smallest lateral dimension is such that the smallest lateral dimension of each metallic waveguide provides spectral selectivity;
    each metallic waveguide is deep enough for the smallest lateral dimension to establish directionality of the specified spectral and thermal radiation emissivity response along an axis of the metallic waveguide but is not so deep that ohmic loss causes the metallic waveguide to reabsorb radiation intended to be emitted; and
    the specified spectral thermal emissivity response is such that each metallic waveguide rejects waves of wavelengths greater than about two times a width of said metallic waveguide.

13. The invention as defined in claim 12 wherein at least one of said waveguides is formed on a substrate and has a waveguide axis and wherein said waveguide axis is oriented obliquely with respect to a normal of said substrate.

14. The invention as defined in claim 12 wherein at least one of said metallic infrared waveguides differs from at least one other of said metallic infrared waveguides by at least one characteristic from the group consisting of: (i) shape, (ii) depth, (iii) spacing, (iv) wall thickness, (v) dimensions, (vi) metal by which said metallic infrared waveguide is coated, (vii) thickness of metal by which said metallic infrared waveguide is coated, (viii) waveguide axis, and (ix) periodicity.

15. The invention as defined in claim 12 wherein at least one of said metallic infrared waveguides is filled with a material that is transparent over said spectral response.

16. The invention as defined in claim 12 wherein said array of metallic infrared (IR) waveguides is formed on a flexible substrate.

* * * * *